United States Patent [19]
Narita

[11] Patent Number: 5,256,564
[45] Date of Patent: Oct. 26, 1993

[54] METHOD FOR MANUFACTURING SEMICONDUCTOR DEVICE HAVING A CONTACT STRUCTURE

[75] Inventor: Kaoru Narita, Tokyo, Japan

[73] Assignee: NEC Corporation, Tokyo, Japan

[21] Appl. No.: 886,938

[22] Filed: May 22, 1992

[30] Foreign Application Priority Data

May 24, 1991 [JP] Japan .................. 3-149534

[51] Int. Cl.$^5$ ............................ H01L 21/44
[52] U.S. Cl. .................. 437/195; 437/194;
437/203; 437/228; 437/235; 437/247
[58] Field of Search ............ 437/194, 195, 228, 231,
437/235, 247, 203, 195

[56] References Cited

U.S. PATENT DOCUMENTS

| | | | |
|---|---|---|---|
| 4,676,867 | 6/1987 | Elkins et al. | 437/228 |
| 4,775,550 | 10/1988 | Chu et al. | 437/231 |
| 4,894,351 | 1/1990 | Batty | 437/228 |
| 5,079,188 | 1/1992 | Kawai | 437/235 |

FOREIGN PATENT DOCUMENTS

| | | | |
|---|---|---|---|
| 0196555 | 8/1986 | Japan | 437/195 |
| 0303741 | 12/1989 | Japan | 437/195 |

*Primary Examiner*—Brian E. Hearn
*Assistant Examiner*—Tuan Nguyen
*Attorney, Agent, or Firm*—Burns, Doane, Swecker & Mathis

[57] ABSTRACT

In order to prevent a passivation film on an inner wall of a contact hole from being thinned to thereby improve an ability of the passivation film, an interlayer insulating film is formed on a semiconductor substrate in a surface region of which a diffusion layer is formed and a contact hole is formed therethrough to expose the diffusion layer. An aluminum wiring layer covering the inner wall of the contact hole and in contact with the diffusion layer is formed, on which a first thin passivation film is formed. After burying the contact hole with a polyimide layer, a second thick passivation film is formed.

16 Claims, 3 Drawing Sheets

5,256,564

METHOD FOR MANUFACTURING SEMICONDUCTOR DEVICE HAVING A CONTACT STRUCTURE

BACKGROUND OF THE INVENTION

1. Field of the Invention

The present invention relates to a semiconductor device and a method of manufacturing the same and, particularly, to a semiconductor device having a contact structure and a method of manufacturing the same.

2. Description of the Prior Art

A typical example of a conventional contact structure of a semiconductor device has been manufactured through the process steps mentioned below:

First, a diffusion region is formed in one of the major surfaces of a semiconductor substrate, then, an interlayer insulating film is formed over the entire major surface. Thereafter, a contact hole is formed in the interlayer insulating film to expose the diffusion region. Then, an aluminum wiring is formed on the interlayer insulating film with masking at least a sidewall of the contact hole and the exposed diffusion region.

In general, a passivation film is formed on the surface of the semiconductor element after the formation of the aluminum wiring. The passivation film is required to have a thickness at least equal to a certain constant thickness, e.g., 1 μm, which is necessary to achieve a desired function of the passivation film. However, with the passivation structure in the conventional contact portion mentioned above, the thickness of the passivation film on an inner wall of the contact hole becomes smaller than that on other portion because formation of the passivation film on a shoulder portion of the contact hole starts earlier in its forming step than formation of the passivation film in the interior of the contact hole.

Therefore, in the conventional manufacturing method of semiconductor device, the function of the passivation film in the contact portion is not enough, resulting in degradation of reliability of the semiconductor device due to corrosion of the aluminum wiring, etc.

BRIEF DESCRIPTION OF THE INVENTION

Object of the Present Invention

An object of the present invention is to provide a semiconductor device having a contact hole structure assuring a satisfactory passivation function and a method of manufacturing the semiconductor device.

Summary of the Present Invention

A semiconductor device according to the present invention is featured by comprising a diffusion layer formed in surface of a semiconductor substrate or a lower layer wiring layer formed on the semiconductor substrate, an interlayer insulating film having a contact hole in a position corresponding to the diffusion region or the lower layer wiring layer, a wiring layer covering an inner wall of the contact hole, being in contact with the diffusion layer or the lower layer wiring layer and extending over the interlayer insulating film, a polyimide layer burying the contact hole and a passivation film covering the wiring layer and the polyimide layer.

A manufacturing method of the semiconductor device according to the present invention is featured by comprising the steps of exposing a surface of a diffusion layer formed in a surface region of the semiconductor substrate or a surface of the lower layer wiring layer formed on the semiconductor substrate by forming a contact hole in the interlayer insulating film, forming a wiring layer covering an entire inner wall surface of the contact hole and being in contact with the diffusion layer or the lower layer wiring layer on the interlayer insulating film, burying the contact hole with polyimide resin and covering the whole surface of the wafer with a passivation film.

According to the semiconductor device of the present invention, the interior of the contact hole is buried with soft polyimide material which is hardly cracked unlike other material such as silica and therefore it is possible to improve humidity proof characteristics of the contact structure.

According to the semiconductor manufacturing method of the present invention, the contact hole is buried with polyimide resin and flattened. Since a passivation film having enough thickness is formed on the flattened surface, it is possible to make the thickness of the passivation film uniform on even the inner wall of the contact hole, resulting in a contact structure exhibiting satisfactoty passivation characteristics.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein.

DETAILED DESCRIPTION OF THE PREFERRED EMBODIMENTS

Figure 1:
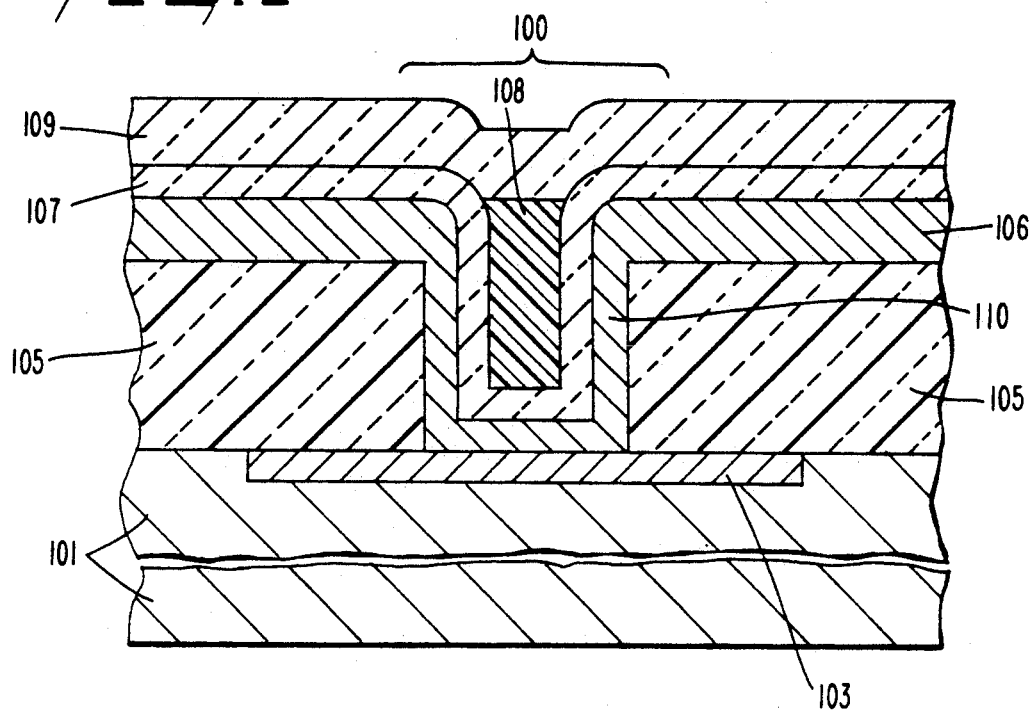
FIG. 1 is a cross section of a semiconductor device according to a first embodiment of the present invention.

A first embodiment of the present invention will be described with reference to the drawings. As shown in FIG. 1, an As diffusion layer 103 having an impurity density of $10^{20}$ atoms/cm$^3$ is provided in one of the major surfaces of a semiconductor substrate 101. On the semiconductor substrate 101 including the diffusion layer 103, a silicon oxide interlayer insulating film 105 having a thickness of 1.5 μm is formed. A contact hole 110 up to the diffusion layer 103 is formed in the interlayer insulating film 105. An aluminum wiring layer 106 having a thickness of 1.0 μm is formed continuously on an inner wall surface of the contact hole 110, on a surface of the interlayer insulating film 105 and a surface of the diffusion layer 103 exposed by the contact hole. Further, a silicon nitride film 1000 Å thick is formed on the wiring layer 106 as a first passivation film 107. A polyimide layer 108 buries a portion of the contact hole 110 surrounded by the first passivation film 107. Further, a silicon nitride film 1 μm thick is formed continuously on the polyimide layer burying the contact hole and on a portion of the first passivation film 107 on which polyimide is not formed, as a second passivation film 109.

According to the semiconductor device of this embodiment, polyimide resin buries a cavity defined by the first passivation film 107 on the inner wall of the contact hole and on the diffusion layer exposed thereby. Therefore, polyimide resin which is soft material can absorb stress exerted to the portion of the contact hole. Young's modulus of polyimide resin is 300 kg/mm$^2$ and that of silica is 8000 kg/mm$^2$. Since, therefore, polyimide resin itself is hardly cracked compared with silica, it is possible to improve the function of passivation in the contact hole portion. Further, since the second passivation film 109 is formed on the polyimide resin, it is possible to make a portion 100 around and including the contact hole flat. In addition, it is possible to minimize water immigration into a boarder area between the first passivation film 107 and the polyimide layer 108.

Figure 2A:
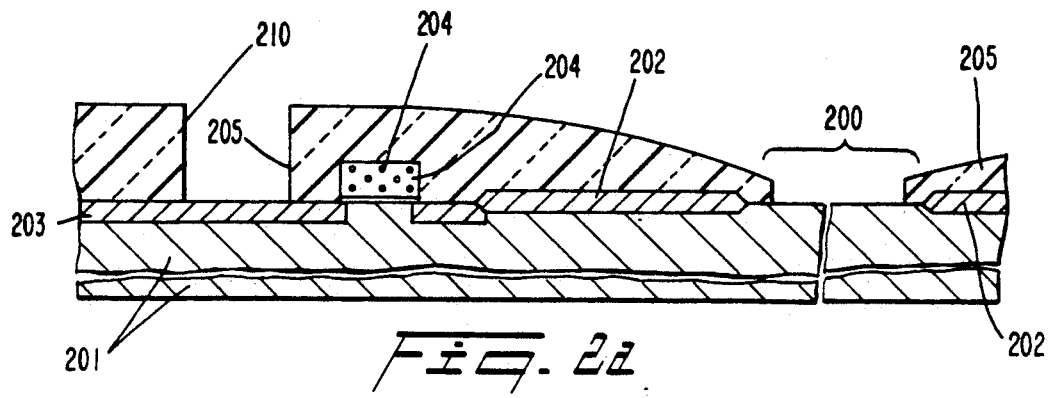
FIGS. 2(a)–(f) show in cross section steps of a manufacturing method of a semiconductor device, according to a second embodiment of the present invention.

A second embodiment of the present invention will be described with reference to FIGS. 2(a) to 2(f). In this embodiment, the present invention is applied to a contact structure to a diffusion region of a field effect transistor. As shown in FIG. 2(a), element isolation films 202 are formed selectively on a surface of a semiconductor substrate 201. On an active region defined by the adjacent element isolation films, a diffusion layer 203 is formed using a gate electrode 204 as a mask. Impurity of the diffusion layer 203 may be, for example, As and impurity density may be, for example, 10$^{20}$ atoms/cm$^3$. Thereafter, an interlayer insulating film 205 is formed on the surface of the semiconductor substrate 201 by CVD. This insulating film 205 is, for example, a silicon oxide film having a thickness of, for example, 1.5 μm. Thereafter, a portion of the insulating film 205 corresponding to a scribing line 200 is removed. The scribing line 200 has a width not less than 50 μm. Thereafter, in order to expose the diffusion layer 203, a contact hole 210 is formed in the interlayer insulating film 205 by plasma etching. Plasma etching can be done by, for example, supplying, as etching gas, a mixture of CHF$_3$ and O$_2$ in flow rate ratio of 5:1 at a mixture gas pressure of 5 Pa.

Figure 2B:
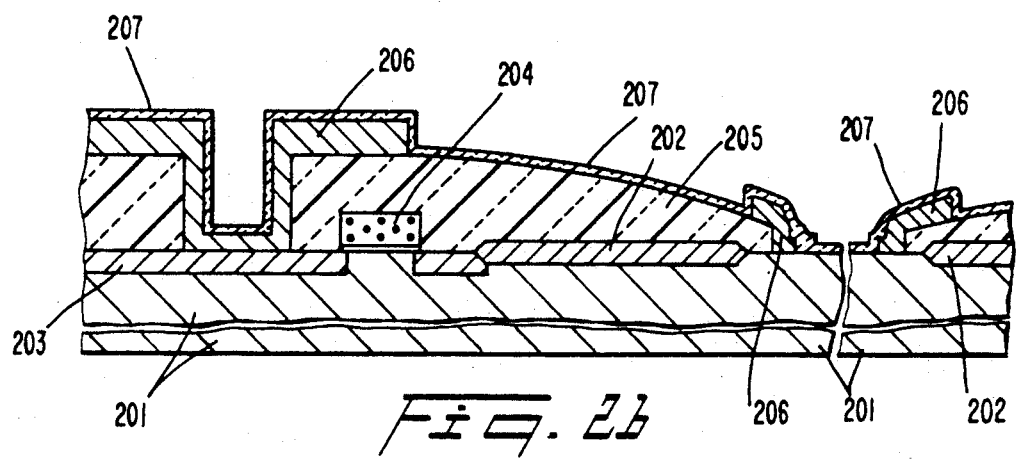
Figure 2C:
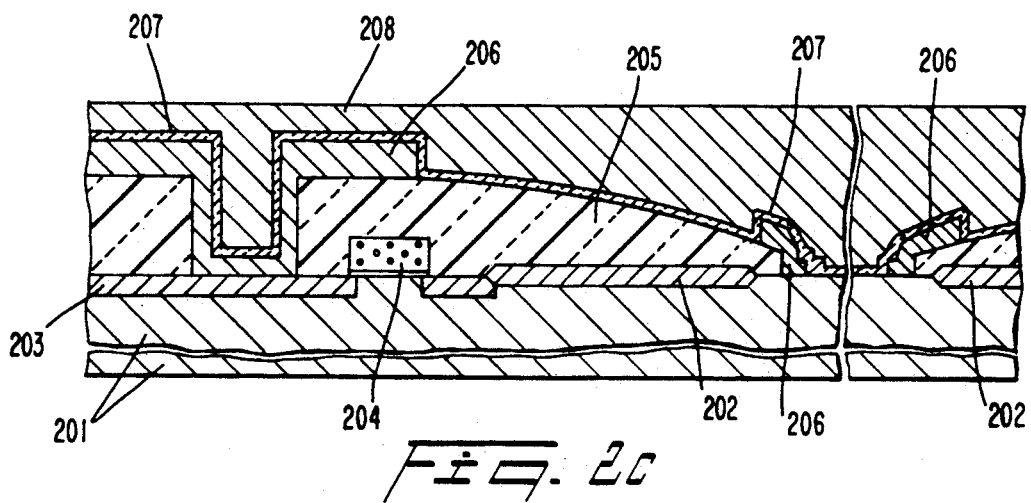
Figure 2D:
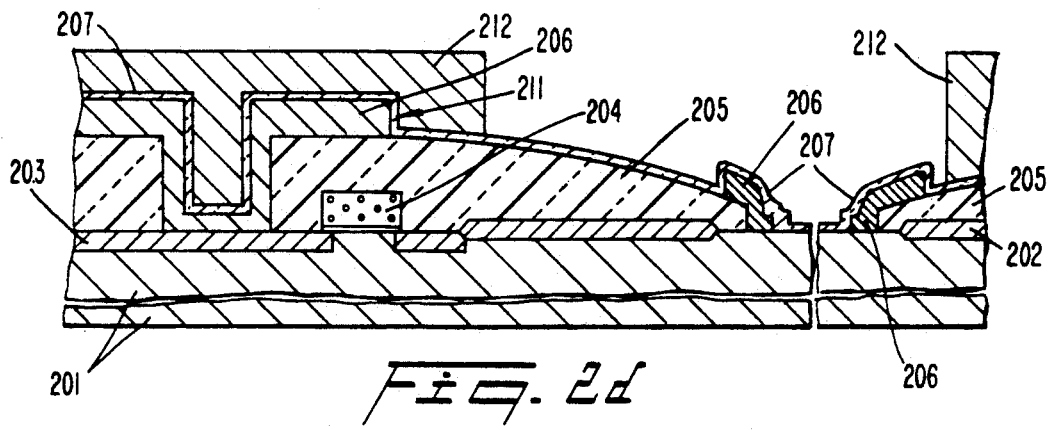

Then, an Al layer is formed on the whole surface by sputtering. The Al layer is, for example, 1.0 μm thick. Then, the Al layer is patterned to form an Al wiring layer 206. Thereafter, a silicon nitride film 1000 Å thick is deposited thereon by CVD, resulting in a first passivation film 207, as shown in FIG. 2(b). Then, as shown in FIG. 2(c), a photosensitive prepolyimide 208 is painted on the whole surface. Then, as shown in FIG. 2(d), the prepolyimide layer 208 except portions thereof on a pattern including the contact hole 210 and a step portion 211 is removed by photolithography. In this stage a portion of the prepolyimide on the scribing line 200 is also removed. Then, the prepolyimide is converted into a polyimide resin 212 by annealing it in nitrogen atmosphere at 350° C.

Figure 2E:
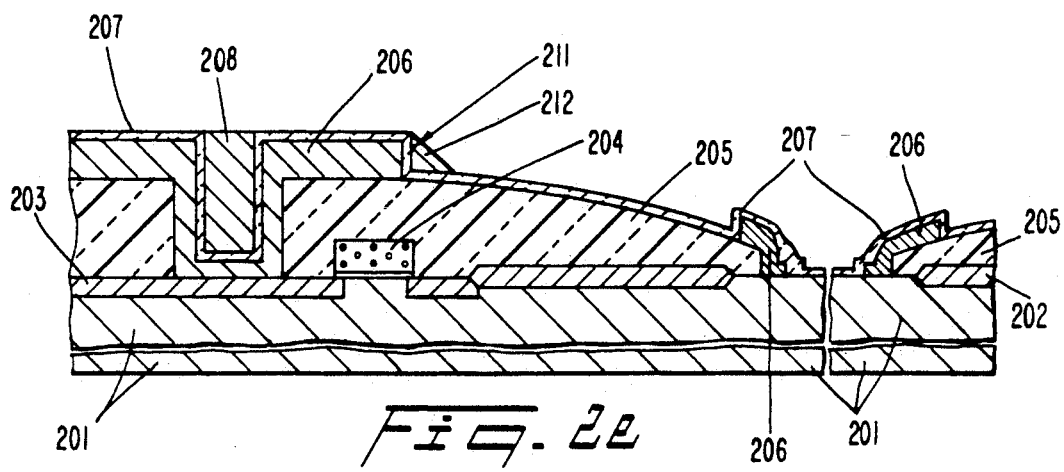

Then, as shown in FIG. 2(e), the polyimide resin 212 is selectively removed by plasma etching using gas mainly containing O$_2$, leaving portions of the polyimide resin 212 in the contact hole 210 and on the step portion 211. The etching may be performed by supplying O$_2$ plasma at a flow rate of 200 sccm and a pressure of 80 Pa. The etching rate of polyimide resin may be not less than 50 times that of the first silicon nitride passivation film 207. Therefore, such selective removal of the polyimide resin 212 is possible. Further, since the selectivity of etching is very large, it is possible to form the first passivation film 207 having small thickness. Thus, it becomes possible to form the first passivation film 207 with respect to a contact hole having very fine pattern, without a producing void.

Figure 2F:
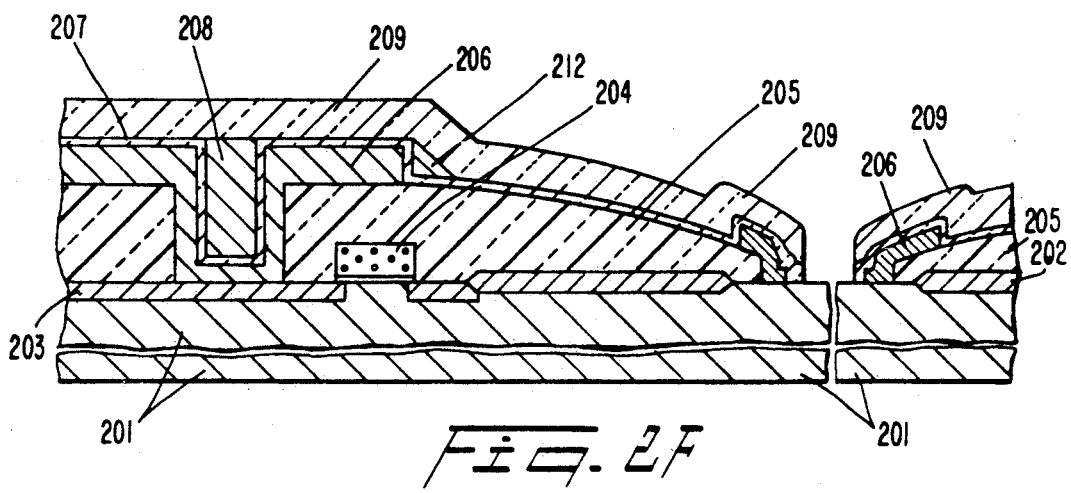

Then, as shown in FIG. 2(f), a silicon nitride film 1 μm thick is deposited by CVD to form a second passivation film 209. Portions of the first and second passivation films on the scribing line are removed.

According to this embodiment, it is possible to preliminarily remove portions of polyimide 212 on an area of the chip in which there is a recess such as the scribing line 200 and the polyimide resin is useless. Therefore, effective etching can be done. Further, since the polyimide resin 212 flattened as shown in FIG. 2(d) is etched, a surface of the polyimide resin left on the step portion 211 has a smooth slope. With such smooth surface, the second passivation film 209 and other films to be formed thereon can be further flattened.

Figure 3:
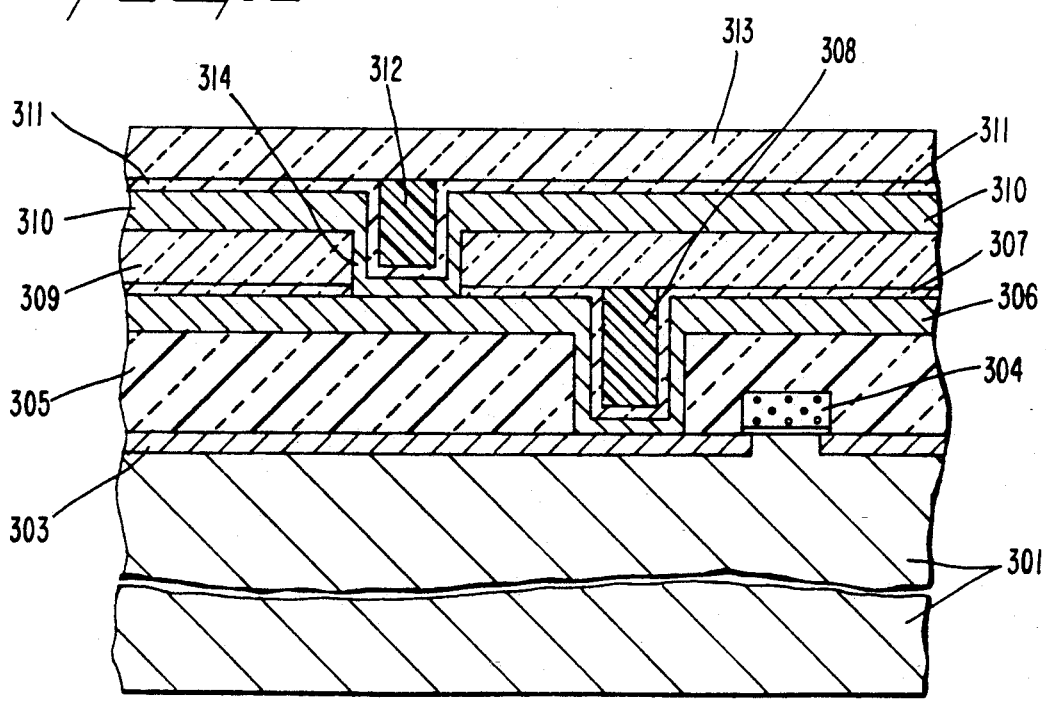
FIG. 3 is a cross section of a semiconductor device according to a third embodiment of the present invention.

A third embodiment of the present invention will be described with reference to FIG. 3.

In this embodiment, the present invention is applied to an Al multilevel wiring structure. In FIG. 3, a gate electrode 304, a diffusion layer 303, an interlayer insulating film 305, a first Al wiring layer 306, a first passivation film 307, a polyimide layer 308 and a second passivation film 309 are formed on a semiconductor substrate 301 in the order by using the method described with reference to FIG. 2. Then, a contact hole 314 is formed through the first and second passivation films 307 and 309 by dry an etching under conditions of etching gas of CF$_3$ and O$_2$ at a flow rate ratio of 5:1 at a pressure 5 Pa. Then, a second Al wiring layer 310 is formed by sputtering such that it is connected to the first Al wiring layer 306 through the contact hole 314. Thereafter, a first passivation film 311, a polyimide layer 312 and a second passivation film 313 are formed in the order by using the same method as that described with reference to FIG. 2.

Although the present invention has been described with reference to specific embodiments, this description is not meant to be construed in a limiting sense. Various modifications of the disclosed embodiments will become apparent to persons skilled in the art upon reference to the description of the present invention. It is therefore that the appended claims will cover any modifications or embodiments as fall within the true scope of the present invention.

What is claimed is:

1. A method of manufacturing a contact structure, comprising the steps of:
    forming an insulating film on a conductive member;
    providing a contact hole in said insulating film to expose a portion of said conductive member through said contact hole;
    forming a wiring layer continuously covering a side surface of said contact hole, said conductive member exposed through said contact hole and a surface portion of said insulating film;
    forming a first passivation film on said wiring layer;
    burying at least a space in said contact hole surrounded by said first passivation film and painting said first passivation film with a solution containing base material of a soft material;
    removing a portion of said solution containing base material of said soft material on a scribing line of a substrate by lithography;
    heat-treating said solution containing base material of said soft material to harden and convert it into said soft material;
    selectively removing said soft material except a portion thereof hardened within said contact hole; and forming a second passivation film on said first passivation film and on said soft material burying said space in said contact hole.

2. The method claimed in claim 1, wherein said soft material is polyimide resin.

3. The method as claimed in claim 1, wherein said step of removing a portion of said solution on a scribing line of a substrate by lithography is performed in between the step of painting said first passivation film with said solution containing base material of said soft material and the step of hardening and converting said solution into said soft material.

4. A method of manufacturing a contact structure, comprising the steps of:
selectively forming an element isolation film on a surface of a semiconductor substrate;
forming a diffusion layer on an active region defined by adjacent portions of said element isolation film;
forming an interlayer insulating film over the surface of said semiconductor substrate;
removing a portion of said interlayer insulating film corresponding to a scribing line of a substrate;
forming at least one contact hole in said interlayer insulating film to expose at least a portion of said diffusion layer;
forming a conductive layer on a side surface of said at least one contact hole, on said diffusion layer exposed through said at least one contact hole and over at least a portion of said interlayer insulating film;
patterning said conductive layer to form a wiring layer covering said side surface of said at least one contact hole, said portion of said diffusion layer exposed through said at least one contact hole and a surface portion of said interlayer insulating film;
forming a first passivation film at least on said wiring layer;
painting at least a portion of the surface of said first passivation film including a surface portion thereof within said at least one contact hole with a solution containing base material of a soft material;
removing, except for a portion over said at least one contact hole and except for a portion over a step portion of said first passivation film, a portion of said solution containing base material of said soft material including removing a portion thereof on said scribing line;
converting said solution containing base material of said soft material into said soft material;
selectively removing said soft material to leave a portion of said soft material in said at least one contact hole and on at least said step portion of said first passivation film; and
forming a second passivation film on said first passivation film and on the remaining said soft material.

5. The method claimed in claim 4, further comprising:
removing a portion of said first passivation film and a portion of said second passivation film on said scribing line.

6. The method according to claim 5, wherein said interlayer insulating film is formed by CVD, said at least one contact hole is formed by plasma etching, said conductive layer is formed by sputtering, said first passivation film is formed by CVD, said solution containing base material of said soft material is removed by photolithography, said solution containing base material of said soft material is converted into said soft material by annealing, and said second passivation film is formed by CVD.

7. The method as claimed in claim 6, wherein said interlayer insulating film is a silicon oxide film, said conductive layer is an aluminum layer, said first passivation film is a silicon nitride film, said solution containing base material of said soft material is a photosensitive prepolyimide which is converted into a polyimide resin, and said second passivation film is a silicon nitride film.

8. The method as claimed in claim 7, wherein said scribing line has a width of not less than 50 $\mu$m.

9. The method as claimed in claim 8, wherein said contact structure is to a diffusion region of a field effect transistor.

10. The method as claimed in claim 5, wherein said contact structure is to a diffusion region of a field effect transistor.

11. The method as claimed in claim 4, wherein said interlayer insulating film is formed by CVD, said at least one contact hole is formed by plasma etching, said conductive layer is formed by sputtering, said first passivation film is formed by CVD, said solution containing base material of said soft material is removed by photolithography, said solution containing base material of said soft material is converted into said soft material by annealing, and said second passivation film is formed by CVD.

12. The method as claimed in claim 4, wherein said interlayer insulating film is a silicon oxide film, said conductive layer is an aluminum layer, said first passivation film is a silicon nitride film, said solution containing base material of said soft material is a photosensitive prepolyimide which is converted into a polyimide resin, and said second passivation film is a silicon nitride film.

13. The method as claimed in claim 12, wherein said interlayer insulating film is formed by CVD, said at least one contact hole is formed by plasma etching, said conductive layer is formed by sputtering, said first passivation film is formed by CVD, said solution containing base material of said soft material is removed by photolithography, said solution containing base material of said soft material is converted into said soft material by annealing, and said second passivation film is formed by CVD.

14. The method as claimed in claim 13, wherein said scribing line has a width of not less than 50 $\mu$m.

15. The method of claim 4, wherein said scribing line has a width of not less than 50 $\mu$m.

16. The method as claimed in claim 4, wherein said contact structure is to a diffusion region of a field effect transistor.

* * * * *